(12) United States Patent
Boyama et al.

(10) Patent No.: US 8,980,657 B2
(45) Date of Patent: Mar. 17, 2015

(54) METHOD FOR PRODUCING A GROUP III NITRIDE SEMICONDUCTOR LIGHT-EMITTING DEVICE

(75) Inventors: Shinya Boyama, Kiyosu (JP); Yasuhisa Ushida, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 53 days.

(21) Appl. No.: 13/545,902

(22) Filed: Jul. 10, 2012

(65) Prior Publication Data

US 2013/0017639 A1 Jan. 17, 2013

(30) Foreign Application Priority Data

Jul. 12, 2011 (JP) .................. 2011-153963

(51) Int. Cl.
*H01L 21/00* (2006.01)
*H01L 33/00* (2010.01)
(Continued)

(52) U.S. Cl.
CPC .......... *H01L 33/007* (2013.01); *H01L 21/0242* (2013.01); *H01L 21/02458* (2013.01);
(Continued)

(58) Field of Classification Search
CPC ....... H01L 33/32; H01L 33/025; H01L 33/04; H01L 33/06; H01L 33/14; H01L 21/0262; H01L 21/02579
USPC .......... 438/22, 44, 46, 48; 257/13, 52, 85, 94, 257/103, 324, E21.097, E21.108
See application file for complete search history.

(56) References Cited

U.S. PATENT DOCUMENTS 5,932,896 A * 8/1999 Sugiura et al. .................. 257/94
6,204,084 B1 * 3/2001 Sugiura et al. .................. 438/46
(Continued)

FOREIGN PATENT DOCUMENTS

JP 2005-159341 A 6/2005
JP 2005-235960 A 9/2005
(Continued)

OTHER PUBLICATIONS

Jeon et al., "GaN-Based Light-Emitting Diodes Using Tunnel Junctions", IEEE Journal of selected topics in quantum electronics, vol. 8, No. 4, pp. 739-743 (2002).*
(Continued)

*Primary Examiner* — Marvin Payen
*Assistant Examiner* — Victor Barzykin
(74) *Attorney, Agent, or Firm* — McGinn IP Law Group, PLLC

(57) ABSTRACT

The present invention is a method for producing a light-emitting device whose p contact layer has a p-type conduction and a reduced contact resistance with an electrode. On a p cladding layer, by MOCVD, a first p contact layer of GaN doped with Mg is formed. Subsequently, after lowering the temperature to a growth temperature of a second p contact layer being formed in the subsequent process, which is 700° C., the supply of ammonia is stopped and the carrier gas is switched from hydrogen to nitrogen. Thereby, Mg is activated in the first p contact layer, and the first p contact layer has a p-type conduction. Next, the second p contact layer of InGaN doped with Mg is formed on the first p contact layer by MOCVD using nitrogen as a carrier gas while maintaining the temperature at 700° C. which is the temperature of the previous process.

13 Claims, 2 Drawing Sheets

(51) Int. Cl.
*H01L 21/02* (2006.01)
*H01L 33/14* (2010.01)

(52) U.S. Cl.
CPC ...... *H01L21/02505* (2013.01); *H01L 21/0254* (2013.01); *H01L 21/02579* (2013.01); *H01L 21/0262* (2013.01); *H01L 33/14* (2013.01)
USPC .................. 438/22; 438/46; 257/13; 257/52; 257/85

(56) References Cited

U.S. PATENT DOCUMENTS

| | | | |
|---|---|---|---|
| 6,936,860 B2* | 8/2005 | Sung et al. | 257/99 |
| 7,537,944 B2 | 5/2009 | Kobayakawa | |
| 7,576,363 B2* | 8/2009 | Uemura et al. | 257/94 |
| 7,692,182 B2* | 4/2010 | Bergmann et al. | 257/22 |
| 8,247,792 B2* | 8/2012 | Kim | 257/14 |
| 2002/0149026 A1* | 10/2002 | Takahashi et al. | 257/99 |
| 2005/0135453 A1* | 6/2005 | Kneissl et al. | 372/94 |
| 2005/0224832 A1* | 10/2005 | Wu et al. | 257/103 |
| 2007/0090369 A1* | 4/2007 | Kobayakawa | 257/77 |
| 2007/0246736 A1* | 10/2007 | Senda et al. | 257/103 |
| 2008/0116477 A1* | 5/2008 | Komada | 257/103 |
| 2008/0179601 A1* | 7/2008 | Toda et al. | 257/76 |
| 2010/0044674 A1* | 2/2010 | Kim | 257/13 |
| 2011/0204326 A1* | 8/2011 | Kim | 257/13 |
| 2011/0243172 A1* | 10/2011 | Lin et al. | 372/45.012 |

FOREIGN PATENT DOCUMENTS

| | | |
|---|---|---|
| JP | 2010-062254 A | 3/2010 |
| WO | WO 2005/043582 A2 | 5/2005 |
| WO | WO 2005/043582 A3 | 5/2005 |

OTHER PUBLICATIONS

Kumakura et al., "Low-resistance nonalloyed ohmic contact to p-type GaN using strained InGaN contact layer", Appl. Phys. Lett. 79, pp. 2588-2590 (2001); doi: 10.1063/1.1410336.*

Keller et al., "Effect of atmospheric pressure MOCVD growth conditions on UV band-edge photoluminescence in GaN thin films", Electronic Letters, vol. 31, pp. 1102-1103 (1995).*

Ahn et al., "Effects of a two-step rapid thermal annealing process on Mg-doped p-type GaN films grown by metalorganic chemical vapor deposition", J. Vac. Sci. Technol. B, vol. 19, pp. 215-218 (2001).*

Japanese Office Action dated Feb. 18, 2014, with partial English translation.

* cited by examiner

METHOD FOR PRODUCING A GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device, and more particularly to a method for forming a p contact layer.

2. Background Art

In recent years, there has been an expanding demand for general illumination applications of Group III nitride semiconductor light-emitting devices, and high-power light-emitting devices are being developed. Every year, the driving current is increasing with the development of high-power light-emitting devices. Therefore, the power consumption is remarkably increased due to resistance, causing reduction in light emission performance. To avoid this, the resistance of light-emitting devices must be reduced.

Most of Group III nitride semiconductor light-emitting devices currently produced are of a lateral conductive face-up type or flip-chip type. In the face-up type device, an ITO transparent electrode is formed on almost the entire top surface of the p contact layer. In the flip-chip type device, a reflecting electrode of high-reflectivity metal such as Ag or its alloy is formed on almost the entire top surface of the p contact layer. To reduce the resistance of light-emitting devices, the contact resistance between the p contact layer and the electrode may be reduced. Improved light emission performance and uniform light emission distribution can be expected by reducing the contact resistance.

In a known method to reduce the contact resistance between the p contact layer and the electrode, p-InGaN is used as a p contact layer instead of conventionally known p-GaN. InGaN has a smaller work function than GaN, and has a work function closer to that of the electrode material. Thereby, the contact resistance can be reduced. Japanese Patent Application Laid-Open (kokai) No. 2010-62254 discloses a p-type contact layer comprising a p-type first contact layer formed of p-InGaN and a p-type second contact layer formed of p-GaN in this order from and on a p electrode. Such a structure of the p contact layer can reduce the contact resistance between the p contact layer and the electrode. A method is also well known to restrain evaporation of In and improve crystallinity of InGaN by employing nitrogen as a carrier gas when forming InGaN by MOCVD.

To reduce the resistance of the device, p-type activation is required for a Group III nitride semiconductor doped with Mg. This is usually done by thermal treatment in an atmosphere containing no hydrogen.

However, this method may degrade crystallinity. A method disclosed by Japanese Patent Application Laid-Open (kokai) No. 2005-159341 is also suggested. Japanese Patent Application Laid-Open (kokai) No. 2005-159341 discloses a method for p-type activation of a Group III nitride semiconductor without degradation of crystallinity, the method comprising: forming a Group III nitride semiconductor doped with a p-type dopant in a hydrogen or ammonia atmosphere at a temperature of 1000° C. or higher, lowering the temperature by 50° C. or more to maintain at 900° C. or higher, and thereafter stopping the supply of hydrogen or ammonia to replace with an inactive gas such as nitrogen.

Even with the method disclosed by Japanese Patent Application Laid-Open (kokai) No. 2010-62254 or 2005-159341, however, difficulty is encountered in reducing the contact resistance with the electrode while achieving p-type conduction of the p contact layer formed of InGaN. The resistance of the device cannot be sufficiently reduced. Therefore, both the resistance of the p contact layer and the contact resistance with the electrode must be reduced.

SUMMARY OF THE INVENTION

In view of the foregoing, an object of the present invention is to reduce the resistance of the p contact layer and the contact resistance with the electrode in a Group III nitride semiconductor light-emitting device.

In a first aspect of the present invention, there is provided a method for producing a Group III nitride semiconductor light-emitting device having a p contact layer, wherein a process for forming the p contact layer comprising:

a first process of forming a first p contact layer of GaN doped with Mg, by MOCVD using ammonia as a nitrogen source, hydrogen as a carrier gas;

a second process of lowering the temperature to a growth temperature of a second p contact layer being formed in the subsequent process, decreasing or stopping the supply of ammonia, and switching the carrier gas from hydrogen to nitrogen; and a third process of forming a second p contact layer of InGaN doped with Mg on the first p contact layer by MOCVD using nitrogen as a carrier gas while maintaining the temperature of the second process.

Preferably, the growth temperature of the first p contact layer is 1000° C. or higher, and the growth temperature of the second p contact layer is 700° C. to 900° C. It is because when the growth temperature falls within this range, a p contact layer with good crystallinity can be formed. More preferably, the growth temperature of the first p contact layer is 1000° C. to 1050° C., and the growth temperature of the second p contact layer is 700° C. to 800° C. Further preferably, the growth temperature of the first p contact layer is 1000° C. to 1020° C., and the growth temperature of the second p contact layer is 700° C. to 750° C.

Preferably, the first p contact layer has a Mg concentration of $1\times10^{19}$/cm$^3$ to $7\times10^{19}$/cm$^3$, and the second p contact layer has a Mg concentration of $2\times10^{19}$/cm$^3$ to $2\times10^{20}$/cm$^3$. When the Mg concentration falls within this range, a p contact layer can be formed with reduced resistance as well as with good crystallinity. The Mg concentration of the first p contact layer may be same as or different from that of the second p contact layer. More preferably, the first p contact layer has a Mg concentration of $4\times10^{19}$/cm$^3$ to $7\times10^{19}$/cm$^3$, and the second p contact layer has a Mg concentration of $5\times10^{19}$/cm$^3$ to $1\times10^{20}$/cm$^3$.

Preferably, the first p contact layer has a thickness of 10 nm to 100 nm, and the second p contact layer has a thickness of 1 nm to 10 nm. When the thickness falls within this range, the resistance of the p contact layer as a whole can be reduced. More preferably, the first p contact layer has a thickness of 30 nm to 70 nm, and the second p contact layer has a thickness of 1 nm to 5 nm.

Preferably, the second p contact layer has an In composition ratio of 10 mol % to 20 mol % to number of mole of total Group III atoms. When the In composition ratio falls within this range, the contact resistance with an electrode, for example, an ITO transparent electrode being formed on the second p contact layer or a reflecting electrode formed of a high-reflectivity metal such as Ag, can be sufficiently reduced. More preferably, the In composition ratio is 15 mol % to 20 mol % to number of mole of total Group III atoms.

In the second process, a temperature lowering rate when lowering the temperature to the growth temperature of the second p contact layer is preferably 1° C./sec to 3° C./sec. When the temperature lowering rate falls within this range, nitrogen release from GaN crystal forming the first p contact layer 151 can be suppressed, thereby degradation of crystallinity can be prevented.

The supply of ammonia may be decreased or stopped after the temperature was lowered to the growth temperature of the second p contact layer or while lowering the temperature. Similarly, the carrier gas may be switched from hydrogen to nitrogen after the temperature was lowered to the growth temperature of the second p contact layer or while lowering the temperature. Switching the carrier gas while lowering the temperature is preferable because nitrogen release from the crystal can be further suppressed, and degradation of crystallinity can be prevented.

Before starting the third process after the second process, the temperature and the atmosphere are preferably maintained for one to ten minutes. Thereby, Mg can be further activated in the first p contact layer. More preferably, the temperature and the atmosphere are maintained for two to five minutes.

A second aspect of the present invention is drawn to a specific embodiment of the production method according to the first aspect, wherein the growth temperature of the first p contact layer is 1000° C. or higher, and the growth temperature of the second p contact layer is 700° C. to 900° C.

A third aspect of the present invention is drawn to a specific embodiment of the production method according to the first or second aspect, wherein the second p contact layer has an In composition ratio of 10 mol % to 20 mol % to number of mole of total Group III atoms.

According to the present invention, resistance reduction due to p-type conduction of the p contact layer and reduction of the contact resistance between the electrode and the p contact layer can be both achieved. As a result, the resistance of the Group III nitride semiconductor light-emitting device can be reduced. P-type activation of the first p contact layer 151 can be done during the successive processes for forming the second p contact layer, thereby the production process is simplified.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
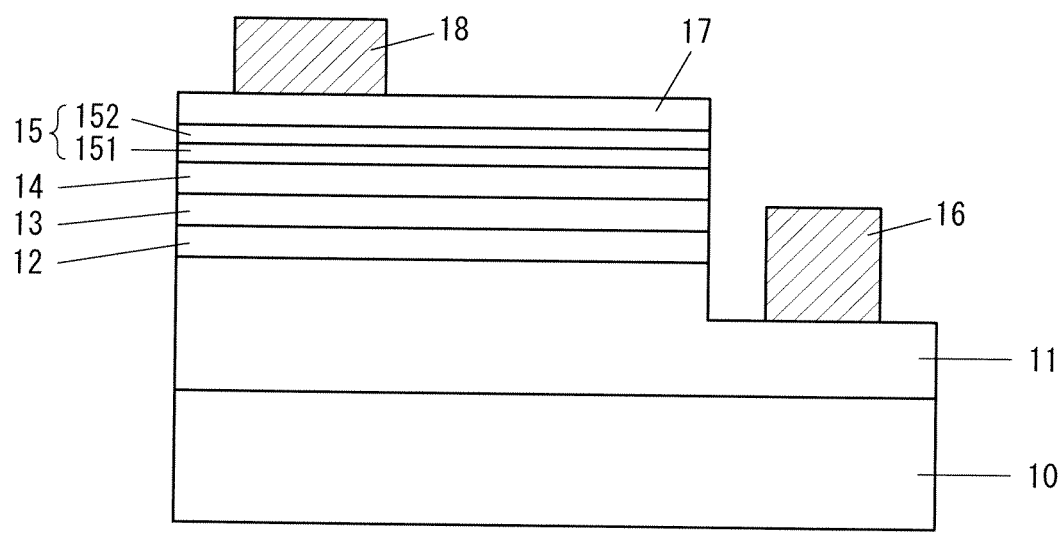
FIG. 1 shows the configuration of a Group III nitride semiconductor light-emitting device according to Embodiment 1.

FIG. 1 shows the configuration of a Group III nitride semiconductor light-emitting device according to Embodiment 1.

The Group III nitride semiconductor light-emitting device according to Embodiment 1 includes a sapphire substrate 10; and an n contact layer 11, an n cladding layer 12, a light-emitting layer 13, a p cladding layer 14, and a p contact layer 15, each of the layers being formed of Group III nitride semiconductor, are sequentially deposited on the sapphire substrate 10 via an AlN buffer layer (not illustrated). Moreover, a trench having a depth extending from the top surface of the p-type contact layer 15 to the n contact layer 11, and an n-electrode 16 is formed on the surface of the n contact layer 11 exposed at the bottom of the trench. An ITO transparent electrode 17 is formed on almost the entire top surface of the p contact layer 15, and a p electrode 18 is formed on the transparent electrode 17.

A concave and convex configuration such as a dot pattern or a stripe pattern may be formed on the surface at the n contact layer 11 side of the sapphire substrate 10 to improve light extraction performance. The sapphire substrate 10 may be replaced with a growth substrate formed from, for example, SiC, Si, ZnO, spinel, or GaN.

The n contact layer 11 is formed of n-GaN with a Si concentration of $1 \times 10^{18}/cm^3$ or more. To reduce the contact resistance with the n-electrode 16, the n contact layer 11 may be formed of multiple layers with different Si concentrations.

The n cladding layer 12 has a superlattice structure formed of fifteen layer units, each including an undoped InGaN layer (thickness: 4 nm), an undoped AlGaN layer (thickness: 0.8 nm), and a Si-doped n-GaN layer (thickness: 1.6 nm), which are deposited in this order. The initial layer of the n cladding layer 12, that is, the layer being in contact with the n contact layer 11, is an InGaN layer. The final layer of the n cladding layer 12, that is, the layer being in contact with the light-emitting layer 13 is an n-GaN layer. The overall thickness of the n cladding layer 12 is 96 nm.

An ESD layer for improving electrostatic breakdown voltage of the device may be formed between the n contact layer 11 and the n cladding layer 12. For example, the ESD layer has a three-layer structure including a first ESD layer, a second ESD layer, and a third ESD layer, the layers being sequentially deposited on the n contact layer 11. The first ESD layer has pits (pit density: $1 \times 10^8/cm^2$ or less) on the surface at the light-emitting layer 13 side thereof. The first ESD layer is formed of GaN having a thickness of 200 nm to 1000 nm and a Si concentration of $1 \times 10^{16}$ to $5 \times 10^{17}/cm^3$. The second ESD layer has pits (pit density: $2 \times 10^8/cm^2$ or more) on the surface at the light-emitting layer 13 side thereof. The second ESD layer is formed of GaN having a thickness of 50 nm to 200 nm and a carrier concentration of $5 \times 10^{17}/cm^3$ or less. The third ESD layer is formed of GaN, and has a characteristic value, as defined by the product of Si concentration ($/cm^3$) and thickness (nm), of $0.9 \times 10^{20}$ to $3.6 \times 10^{20}$ ($nm/cm^3$). Such a structure of the ESD layer can improve electrostatic breakdown voltage, emission performance, and reliability, and reduce the current leakage.

The light-emitting layer 13 has a MQW structure in which an undoped InGaN well layer and an undoped AlGaN barrier layer are alternately deposited in a repeated manner. A capping layer formed of AlGaN having an Al composition ratio below that of the barrier layer may be formed between the well layer and the barrier layer at the same growth temperature as employed for the well layer. When such a capping layer is provided, emission performance can be improved, since the capping layer prevents release of In from the well layer during heating for formation of the barrier layer. A layer formed of undoped GaN and undoped AlGaN may be formed between the light-emitting layer 13 and the p cladding layer 14 to prevent the diffusion of Mg from the p cladding layer 14 to the light-emitting layer 13.

The p cladding layer 14 has a structure including seven layer units, each including a p-InGaN layer (thickness: 1.7 nm) and a p-AlGaN layer (thickness: 3.0 nm) which are sequentially deposited. The initial layer of the p cladding layer 14, which is in contact with the light-emitting layer 13, is the p-InGaN layer, and the final layer of the p cladding layer 14, which is in contact with the p contact layer 15, is the p-AlGaN layer. The overall thickness of the p cladding layer 14 is 32.9 nm. Mg is employed as a p-type impurity.

The p contact layer 15 has a structure including a first p contact layer 151 and a second p contact layer 152 which are sequentially deposited on the p cladding layer 14. The first p contact layer 151 is formed of p-GaN, and the second p contact layer 152 is formed of p-InGaN. When the thickness and the Mg concentration of the first p contact layer 151 and the second p contact layer 152 fall within the following range, the overall resistance of the p contact layer 15 can be sufficiently reduced. The first p contact layer 151 has a thickness of 6 nm to 7 nm and a Mg concentration of $4 \times 10^{19}/cm^3$ to $7 \times 10^{19}/cm^3$. The second p contact layer 152 has a thickness of 2 nm to 4 nm and a Mg concentration of $5 \times 10^{19}/cm^3$ to $1 \times 10^{20}/cm^3$. The second p contact layer 152 has an In composition ratio of 0.1 to 0.2. When the In composition ratio falls within this range, the second p contact layer 152 can be formed without degrading the crystallinity, and the contact resistance with an ITO transparent electrode 17 above and on contact with the second p contact layer 152 can also be reduced.

Next will be described processes for producing the Group III nitride semiconductor light-emitting device according to Embodiment 1 with reference to FIGS. 2A to 2C.

Figure 2A:
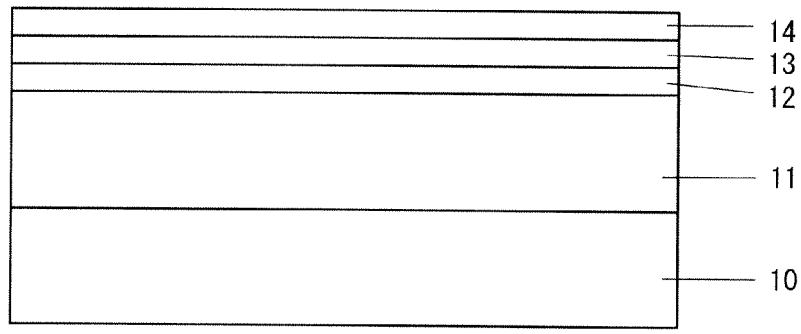
FIGS. 2A to 2C are sketches showing processes for producing the Group III nitride semiconductor light-emitting device according to Embodiment 1.

Firstly, on a sapphire substrate 10, by MOCVD, a buffer layer (not illustrated), an n contact layer 11, an n cladding layer 12, a light-emitting layer 13, and p cladding layer 14 are sequentially deposited (FIG. 2A). The gases employed are as follows: TMG (trimethylgallium) as a Ga source; TMI (trimethylindium) as an In source; TMA (trimethylaluminum) as an Al source; ammonia as a nitrogen source; and hydrogen or nitrogen as a carrier gas. Silane is employed as an n-type dopant gas.

Figure 2B:
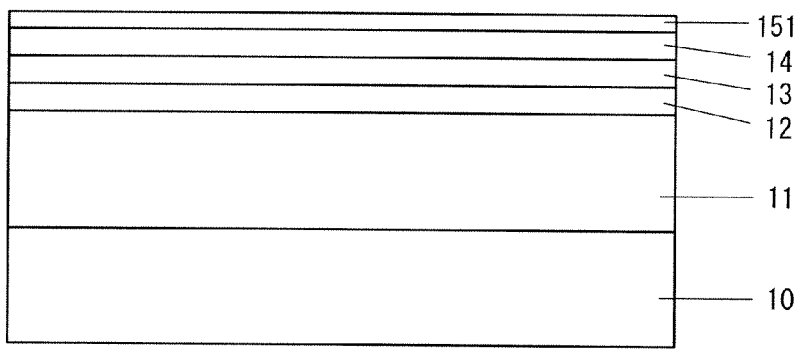
Figure 2C:
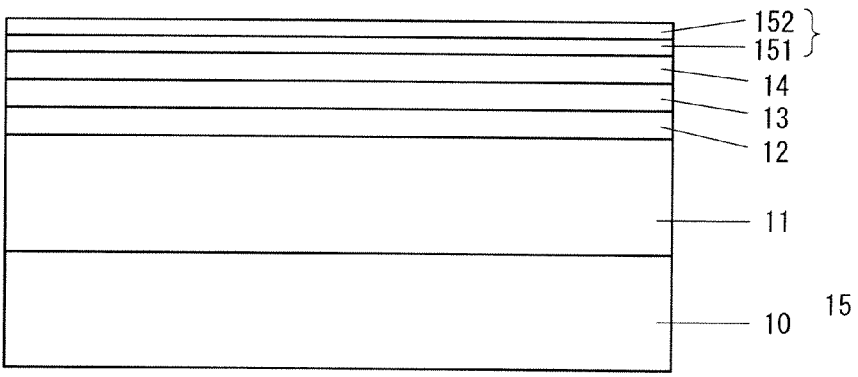

Subsequently, on the p cladding layer 14, by MOCVD, a first p contact layer 151 is formed of GaN doped with Mg (FIG. 2B). The gases employed are as follows: hydrogen as a carrier gas; TMG as a Ga source, and ammonia as a nitrogen source. $Cp_2Mg$ (biscyclopentadienylmagnesium) is employed as a p-type dopant gas. The first p contact layer 151 has a thickness of 6 nm to 7 nm and a Mg concentration of $4 \times 10^{19}/cm^3$ to $7 \times 10^{19}/cm^3$. The growth temperature is 1000° C. or higher. At this growth temperature, the first p contact layer 151 with good crystallinity can be formed. More preferably, the growth temperature is 1000° C. to 1020° C. The pressure is an atmospheric pressure. When the pressure falls within this range, the first p contact layer 151 with good crystallinity can be formed.

Next, after lowering the temperature to 700° which is the growth temperature of a second p contact layer 152 being formed in the subsequent process, the supply of ammonia is stopped, and the carrier gas is switched from hydrogen to nitrogen. The supply of TMG may not be stopped, or may be stopped. The pressure is the same as that when forming the first p contact layer 151. The temperature of 700° C. and the nitrogen atmosphere are maintained for two to five minutes. Although such a holding time is not essential, it is preferable to set a holding time in order to sufficiently activate Mg. Thereby, Mg is activated in the first p contact layer 151, and the first p contact layer 151 has a p-type conduction. Moreover, the p cladding layer 14 also has a p type conduction at the same time with the first p contact layer 151.

The supply of ammonia may not be stopped but may be decreased to a certain amount. In this case, the supply amount of ammonia is preferably decreased to 10% or less. Otherwise, Mg is not sufficiently activated. Most preferably, the supply of ammonia is stopped. The supply of ammonia may be stopped or decreased while lowering the temperature or after the temperature was lowered. Similarly, the carrier gas may be switched while lowering the temperature or after the temperature was lowered. Switching the carrier gas while lowering the temperature is preferable because nitrogen release from the crystal can be further suppressed, and degradation of crystallinity can be prevented. A temperature lowering rate when lowering the temperature to 700° C. is preferably 1° C./sec to 3° C./sec. When the temperature lowering rate falls within this range, evaporation of nitrogen from GaN crystal forming the first p contact layer 151 can be effectively suppressed.

Subsequently, the temperature is maintained at 700° C., which is the temperature of the previous process, nitrogen is employed as a carrier gas, ammonia, TMG, TMI are supplied as a raw material gas, and $Cp_2Mg$ is supplied as a p-type dopant gas. Under these conditions, by MOCVD, a second p contact layer 152 of InGaN doped with Mg is formed on the first p contact layer 151 (FIG. 2C). The second p contact layer 152 has a thickness of 2 nm to 4 nm and a Mg concentration of $5 \times 10^{19}/cm^3$ to $1 \times 10^{20}/cm^3$. The second p contact layer 152 has an In compositional ratio of 10 mol % to 20 mol % to total number of mole of Ga and In. That is $10 \leq 100x \leq 20$ in $In_xGa_{1-x}N$. The pressure when forming the second p contact layer 152 is atmospheric pressure Pa. When the pressure falls within this range, the first p contact layer 151 with good crystallinity can be formed.

The growth temperature of the second p contact layer 152 is 700° C. The temperature is not limited to this, but may be 700° C. to 900° C. When the growth temperature falls within this range, the first p contact layer 151 with good crystallinity can be formed.

Thereafter, a specific portion of the p contact layer 15 is subjected to dry etching, to thereby form a trench having a depth extending from the top surface of the p contact layer 15 to the n contact layer 11. An ITO transparent electrode 17 is formed almost the entire top surface of the p contact layer 15. Then, a p electrode 18 is formed on the transparent electrode 17, and an n-electrode 16 is formed on the surface of the n contact layer 11 exposed at the bottom of the trench. Thus, the Group III nitride semiconductor light-emitting device shown in FIG. 1 is produced.

At this time, the transparent electrode 17 comes in contact with the second p contact layer 152 of the p contact layer 15. The second p contact layer 152 is formed of p-InGaN having an In composition ratio of 10 mol % to 20 mol % to number of mole of total Group III atoms. That is $10 \leq 100x \leq 20$ in $In_xGa_{1-x}N$. The p-InGaN has a smaller work function than p-GaN which forms the first p contact layer 151. Therefore, a difference in work function between the second p contact layer 152 and the ITO transparent electrode 17 is smaller than in case of p-GaN. As a result, the contact resistance between the second p contact layer 152 and the transparent electrode 17 can be reduced.

The second p contact layer 152 is not subjected to thermal treatment to activate Mg and produce a p-type conduction.

However, since the second p contact layer 152 is thin enough, the resistance of the p contact layer 15 can be sufficiently reduced as a whole.

According to the aforementioned method for growing the p contact layer 15, the resistance of the first p contact layer 151 can be reduced, and the contact resistance can be reduced because the second p contact layer 152 being in contact with the transparent electrode 17, is formed of InGaN. Thus, the resistance of the Group III nitride semiconductor light-emitting device according to Embodiment 1 can be reduced.

Moreover, p-type activation of the first p contact layer 151 can be continuously done during the successive processes for forming the second p contact layer 152. Thereby, p-type activation after the formation of the second p contact layer 152 can be omitted. Thus, the production process is simplified.

The Group III nitride semiconductor light-emitting device according to Embodiment 1 is of a face-up type. However, the present invention is not limited to this, and a Group III nitride semiconductor light-emitting device may have any structure, so long as an electrode is formed on a p contact layer. For example, the present invention can be applied to a flip-chip type device or a device having a vertical conductive structure obtained by using a conductive substrate or removing a substrate by a laser lift-off technique. Thus, as in Embodiment 1, the contact resistance with the electrode as well as the resistance of the p contact layer can be reduced.

Usually, after the formation of the p contact layer, a plurality of thermal treatments are carried out such as thermal treatment for baking an ITO transparent electrode, or alloy treatment (thermal treatment) for obtaining an ohmic contact with a p electrode and an n electrode. They do not affect the effect of the present invention, that is, the p-type conduction of the p contact layer 11 and the reduction of the contact resistance with the electrode.

The Group III nitride semiconductor light-emitting device produced by the method of the present invention can be employed in, for example, an illumination apparatus.

What is claimed is:

1. A method for producing a Group III nitride semiconductor light-emitting device, said method comprising:
    forming a p contact layer;
    forming a buffer layer, an n contact layer, an n cladding layer, a light-emitting layer, and a p cladding layer on a sapphire substrate;
    forming a first p contact layer of GaN having a thickness of 10 nm to 100 nm doped with Mg on the p cladding layer at a first growth temperature, by MOCVD (metalorganic chemical vapor deposition) using ammonia gas as a nitrogen source, TMG (trimethylgallium) as a Ga source, $Cp_2Mg$ (bis-cyclopentadienylmagnesium) as a p-type dopant gas, and hydrogen as a carrier gas;
    lowering a growth temperature with a lowering rate of 1° C./sec to 3° C./sec from the first growth temperature to a second growth temperature of a second p contact layer being formed in a subsequent process;
    stopping supplies of source gases of ammonia, TMG, and $Cp_2Mg$, and switching the carrier gas from hydrogen to nitrogen at any time in a period of said lowering the growth temperature;
    activating the Mg of the p cladding layer and the first p contact layer to achieve p-type conduction with keeping the supplies of source gases stopped and nitrogen gas supplied for any specified time from 2 min to 5 min and with keeping the growth temperature at the second growth temperature after the growth temperature reaches the second growth temperature;
    supplying the source gases and TMI (trimethylindium) after the specified time has passed;
    forming the second p contact layer of InGaN having a thickness of 1 nm to 10 nm doped with Mg on the first p contact layer at the second growth temperature by MOCVD using nitrogen as the carrier gas; and
    forming an ITO (indium tin oxide) transparent electrode on the second p contact layer,
    wherein the first growth temperature of the first p contact layer is 1000° C. or higher and the second growth temperature of the second p contact layer is 700° C. to 900° C., and the second p contact layer includes an In composition ratio of 10 mol % to 20 mol % to a number of moles of total Group III atoms.

2. A method for producing a Group III nitride semiconductor light-emitting device according to claim 1, wherein the first p contact layer comprises a Mg concentration in a range from $1\times10^{19}/cm^3$ to $7\times10^{19}/cm^3$, and the second p contact layer comprises a Mg concentration in a range from $2\times10^{19}/cm^3$ to $2\times10^{20}/cm^3$.

3. A method for producing a Group III nitride semiconductor light-emitting device according to claim 1, wherein the ITO transparent electrode is disposed on a top surface of the second p contact layer.

4. A method for producing a Group III nitride semiconductor light-emitting device according to claim 1, further comprising a p electrode disposed on a top surface of the ITO transparent electrode.

5. A method for producing a Group III nitride semiconductor light-emitting device according to claim 1, wherein the ITO transparent electrode is disposed on an entirety of a top surface of the second p contact layer.

6. A method for producing a Group III nitride semiconductor light-emitting device according to claim 1, wherein the first p contact layer has a thickness of 6 nm to 7 nm and a Mg concentration in a range from $4\times10^{19}/cm^3$ to $7\times10^{19}/cm^3$.

7. A method for producing a Group III nitride semiconductor light-emitting device according to claim 6, wherein the second p contact layer has a thickness of 2 nm to 4 nm and a Mg concentration in a range from $5\times10^{19}/cm^3$ to $1\times10^{20}/cm^3$.

8. A method for producing a Group III nitride semiconductor light-emitting device according to claim 1, wherein the growth temperature of the first p contact layer is in a range from 1000° C. to 1020° C.

9. A method for producing a Group III nitride semiconductor light-emitting device according to claim 8, wherein said forming the first p contact layer is conducted in an atmospheric pressure.

10. A method for producing a Group III nitride semiconductor light-emitting device according to claim 1, wherein the second growth temperature of the second p contact layer is in a range from 700° C. to 750° C.

11. A method for producing a Group III nitride semiconductor light-emitting device according to claim 1, wherein the first p contact layer has a thickness in a range from 6 nm to 7 nm.

12. A method for producing a Group III nitride semiconductor light-emitting device according to claim 11, wherein the second p contact layer has a thickness of 2 nm to 4 nm.

13. A method for producing a Group III nitride semiconductor light-emitting device according to claim 1, wherein, in said activating the Mg of the p cladding layer and the first p contact layer to achieve the p-type conduction, only the nitrogen gas is supplied for said any specified time from 2 min to 5 min with said keeping the growth temperature at the second growth temperature after the growth temperature reaches the second growth temperature.

\* \* \* \* \*